United States Patent
Tange et al.

(10) Patent No.: US 6,537,709 B2
(45) Date of Patent: Mar. 25, 2003

(54) PHOTO MASK HAVING FILM FORMED FROM HALFTONE MATERIAL, METHOD OF MANUFACTURING PHOTO MASK, AND METHOD OF MANUFACTURING SEMICONDUCTOR DEVICE

(75) Inventors: Kouji Tange, Tokyo (JP); Kunihiro Hosono, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 55 days.

(21) Appl. No.: 09/912,536

(22) Filed: Jul. 26, 2001

(65) Prior Publication Data

US 2002/0102473 A1 Aug. 1, 2002

(30) Foreign Application Priority Data

Jan. 26, 2001 (JP) ......................................... 2001-019244

(51) Int. Cl.[7] ................................................. G03F 9/00
(52) U.S. Cl. ............................................................ 430/5
(58) Field of Search .............................. 430/5, 322, 323, 430/324, 394, 22; 356/401

(56) References Cited

U.S. PATENT DOCUMENTS 5,723,236 A * 3/1998 Inoue et al. .................... 430/5

FOREIGN PATENT DOCUMENTS

| JP | 8-334885 | 12/1996 |
| JP | 10-268504 | 10/1998 |

* cited by examiner

Primary Examiner—S. Rosasco
(74) Attorney, Agent, or Firm—McDermott, Will & Emery

(57) ABSTRACT

A completely-light-shielding Cr section of the scribe-line region assumes a light-shielding structure of self-aligned type. A dicing mark section assumes a light-shielding structure of Cr setback type. A pattern section of a device region assumes a light-shielding structure of HT pattern type.

12 Claims, 5 Drawing Sheets

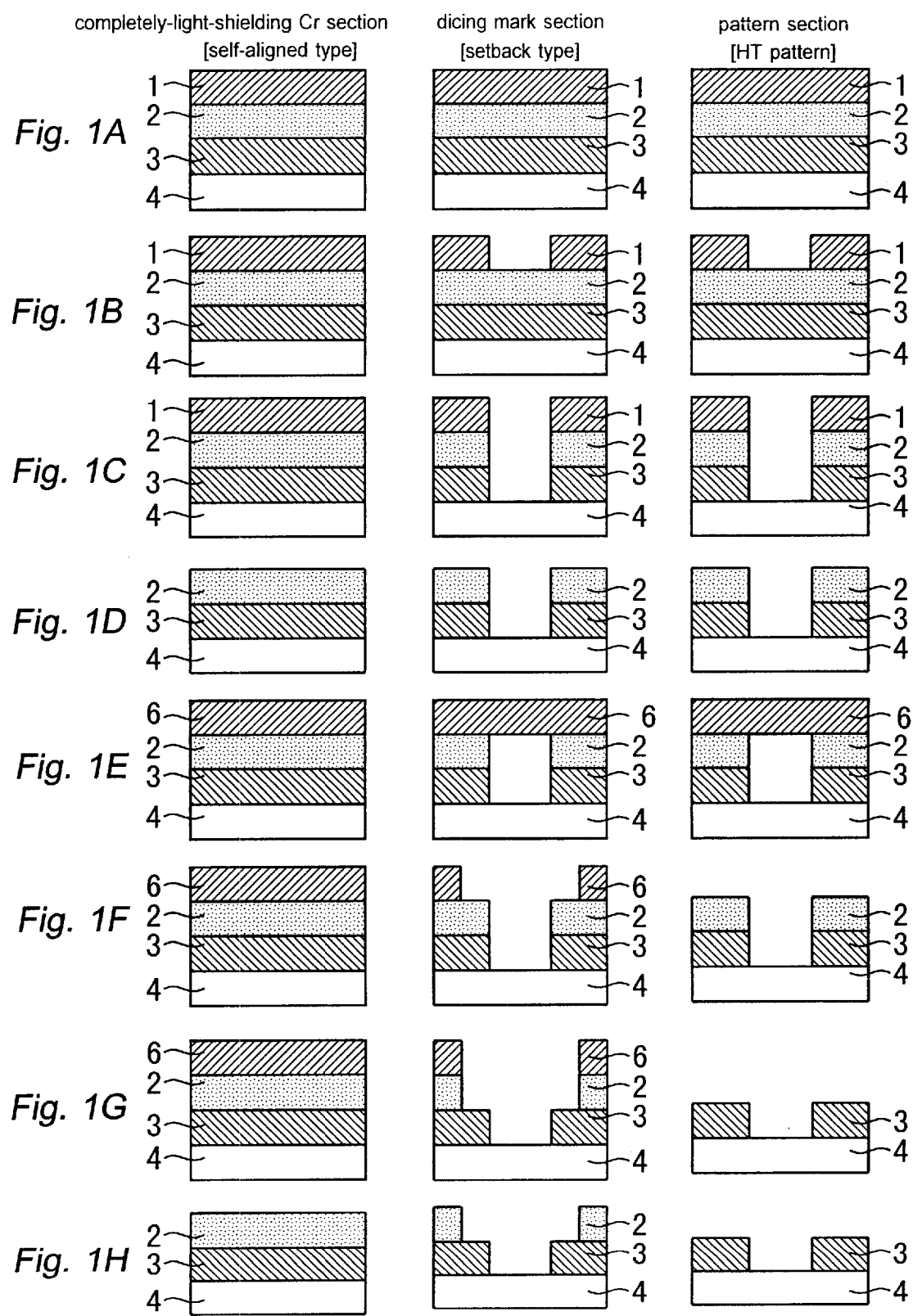

self-aligned type setback type

HT pattern

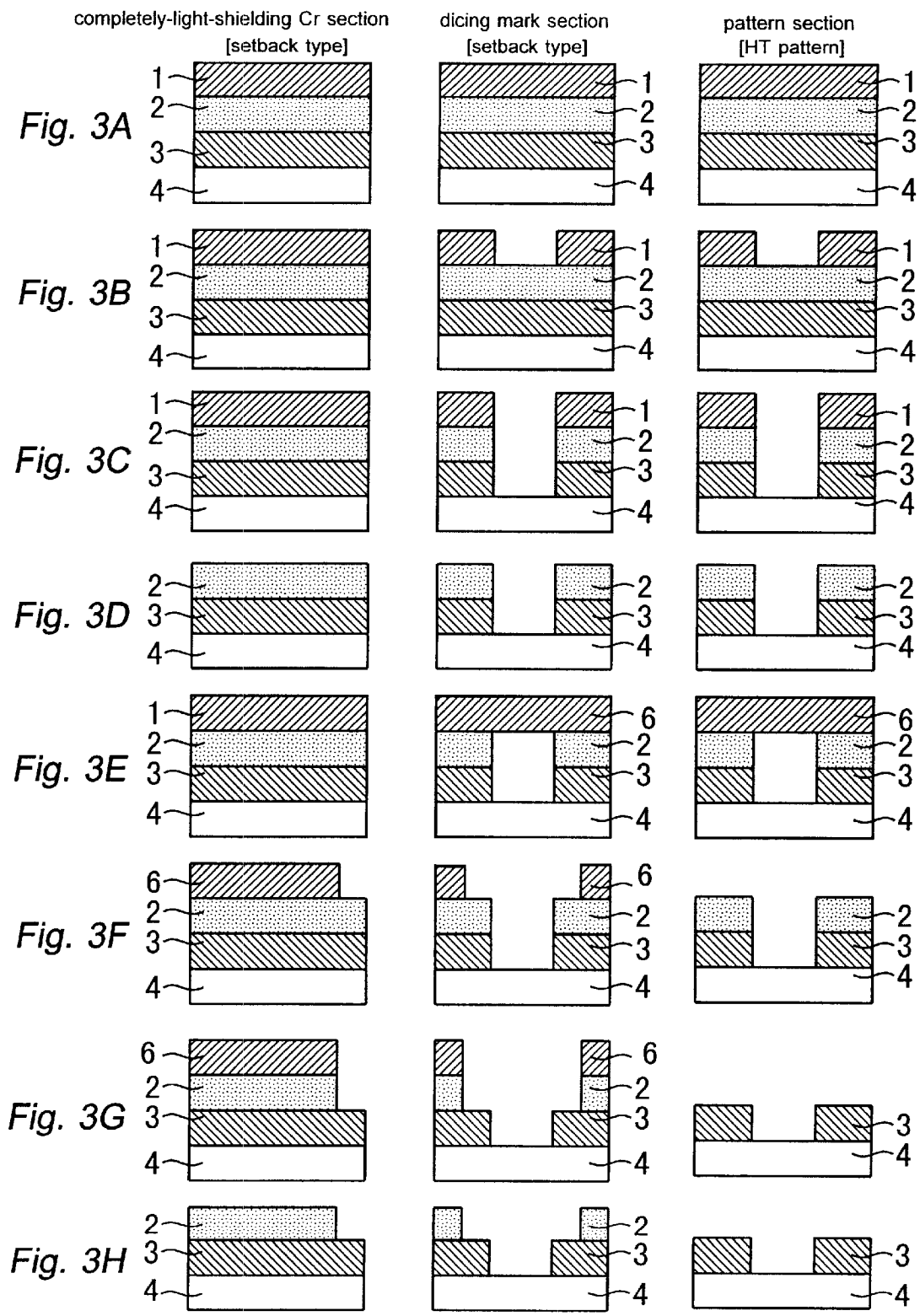

Background Art completely-light-shielding Cr section
[self-aligned type]

dicing mark section
[HT pattern]

pattern section
[HT pattern]

completely-light-shielding Cr section
[self-aligned type]

dicing mark section
[self-aligned type]

pattern section
[HT pattern]

PHOTO MASK HAVING FILM FORMED FROM HALFTONE MATERIAL, METHOD OF MANUFACTURING PHOTO MASK, AND METHOD OF MANUFACTURING SEMICONDUCTOR DEVICE

BACKGROUND OF THE INVENTION

1. Field of the Invention

The present invention relates to a photo mask, and to a method of manufacturing the photo mask, and to a method of manufacturing a semiconductor device using the photo mask. More particularly, the present invention relates to a photo mask having a film formed from halftone material on a translucent substrate, and to a method of manufacturing the photo mask, and to a method of manufacturing a semiconductor device through use of the photo mask.

2. Description of the Background Art

A phase-shift mask is aimed at improving resolving power by means of utilizing a phase difference between light rays. A halftone (hereinafter called "HT") mask is one type of the phase-shift mask. An absorbent corresponding to a light-shielding section of the HT mask is translucent to an exposing light. Further, the absorbent is set so as to reverse the phase of the exposing light which passes through an opening section. Therefore, the sharpness of a pattern edge can be improved.

FIGS. 5A to 5C are cross-sectional views for describing the structure of one conventional HT photo mask. More particularly, FIG. 5A shows the structure of one conventional HT photo mask in a completely-light-shielding chromium (Cr) section of a scribe-line region. FIG. 5B shows the structure of one conventional HT photo mask in a dicing mark section of the scribe-line region. FIG. 5C shows the structure of one conventional HT photo mask in a pattern section of a device region.

In FIGS. 5A to 5C, reference numeral 4 designates a translucent substrate; for example, a quartz (Qz) substrate: 3 designates a HT film; and 2 designates a Cr film. As shown in FIGS. 5A to 5C, a light-shielding structure of self-aligned type is used in the completely-light-shielding Cr section; a HT pattern is used in the dicing mark section; and a HT pattern is used in the pattern section.

FIGS. 6A to 6C are cross-sectional views for describing the structure of another conventional HT photo mask. More particularly, FIG. 6A shows the structure of another conventional HT mask in a completely-light-shielding Cr section of a scribe-line region; FIG. 6B shows the structure of another conventional HT mask in a dicing mark section of the scribe region; and FIG. 6C shows the structure of another conventional HT mask in a pattern section of a device region. In FIGS. 6A to 6C, those elements which are assigned reference numerals identical with those assigned to the elements shown in FIGS. 5A to 5C designate the same elements, and hence repeated explanations thereof are omitted. As shown in FIGS. 6A to 6C, a light-shielding structure of self-aligned type is used in the completely-light-shielding Cr section; a light-shielding structure of self-aligned type is used in the dicing mark section; and a HT pattern is used in a pattern section.

However, the structure of the conventional HT photo mask shown in FIGS. 5A to 5C poses a problem of deteriorating the geometry of a resist on a wafer after the photo mask pattern has been transferred onto the wafer through exposure. Such a deterioration adversely affects the characteristic of an LSI or an IC.

In the structure of the conventional HT photo mask shown in FIGS. 6A to 6C, a large difference in rising edges of an optical image is arisen when a photo mask defect inspection is performed. Therefore, realization of sufficient sensitivity to defects in a photo mask cannot be attained during the inspection.

SUMMARY OF THE INVENTION

The present invention has been conceived to solve the previously-mentioned problems and a general object of the present invention is to provide a novel and useful photo mask having a film formed from halftone material on a translucent substrate, and is to provide a novel and useful method of manufacturing the photo mask, and is to provide a novel and useful method of manufacturing a semiconductor device.

A more specific object of the present invention is to provide a photo mask which makes the geometry of a resist on a wafer appropriate after a photo mask pattern has been transferred to the wafer by means of exposure and which ensures sufficient sensitivity to imperfections in the photo mask during inspection. Further objects of the present invention are to provide a method of manufacturing such photo mask, and to provide a method of manufacturing a semiconductor device through use of the photo mask.

Each of the above objects of the present invention is attained by a following photo mask, and by a following method of manufacturing the photo mask, and by a following method of manufacturing a semiconductor device.

According to a first aspect of the present invention, a photo mask has a film formed from halftone material on a translucent substrate. A light-shield structure of self-aligned type and a light-shielding structure of chromium (Cr) setback type are used in combination for a light-shielding structure in a scribe-line region. A halftone pattern is used for a light-shielding structure in a device region.

Accordingly, there can be provided the photo mask which makes appropriate the geometry of a resist on a wafer after a photo mask pattern has been transferred onto the wafer by exposure. Furthermore, sufficient defect detection sensitivity can be attained during inspection of defects of the photo mask.

According to a second aspect of the present invention, in a method of manufacturing a photo mask having a completely-light-shielding chromium (Cr) section, a dicing mark section, and a pattern section, a halftone film is first formed from halftone material on a translucent substrate. Next, a chromium (Cr) film is formed on the halftone film. Further, a first resist is applied on the Cr film. Next, a first pattern is drawn on the first resist in the dicing mark section and the pattern section. Further, the first resist, on which the pattern is drawn, is developed. Next, the Cr film and the halftone film are etched away from the dicing mark section and the pattern section. Next, the first resist is exfoliated from the completely-light-shielding Cr section, the dicing mark section, and the pattern section. Further, a second resist is applied to the completely-light-shielding Cr section, the dicing mark section, and the pattern section. Next, a second pattern is drawn on the second resist in the dicing mark section and the pattern section. Further, the second resist, on which the pattern is drawn, is developed. Further, a Cr setback structure is formed in the dicing mark section by means of etching the Cr film away from the dicing mark section and the pattern section. Finally, the second resist is exfoliated from the completely-light-shielding Cr section, the dicing mark section, and the pattern section.

Accordingly, there can be provided the photo mask which makes appropriate the geometry of a resist on a wafer after a photo mask pattern has been transferred onto the wafer by exposure. Furthermore, sufficient defect detection sensitivity can be attained during inspection of defects of the photo mask.

According to a third aspect of the present invention, a semiconductor device is manufactured through use of the photo mask. Accordingly, reliability of the semiconductor device can be improved.

Other objects and further features of the present invention will be apparent from the following detailed description when read in conjunction with the accompanying drawings.

BRIEF DESCRIPTION OF THE DRAWINGS

FIGS. 1A to 1H are cross-sectional views for describing the flow of manufacture of a photo mask according to a first embodiment of the present invention;

FIGS. 3A to 3H are views for describing a method of manufacturing a photo mask according to a second embodiment of the present invention;

DETAILED DESCRIPTION OF THE PREFERRED EMBODIMENTS

Figure 2A:
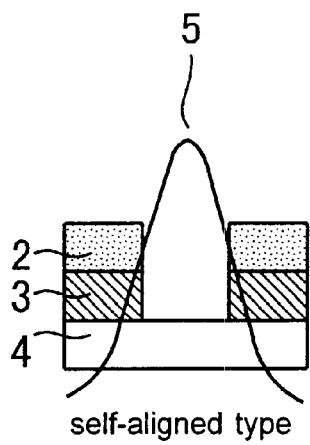
FIGS. 2A to 2C are cross-sectional views for describing an optical image appearing from a HT photo mask at the time of pattern defect inspection.

In the following, principles and embodiments of the present invention will be described with reference to the accompanying drawings. The members and steps that are common to some of the drawings are given the same reference numerals and redundant descriptions therefore may be omitted.

First Embodiment

FIGS. 1A to 1H are cross-sectional views for describing the flow of manufacture of a photo mask according to a first embodiment of the present invention. In FIGS. 1A to 1H, illustrations provided in the left-side column show a completely-light-shielding Cr section in a scribe region; illustrations provided in the center column show a dicing mark section in the scribe region; and illustrations provided in the right-side column show a pattern section in a device region.

First, as shown in FIG. 1A, a halftone (HT) film 3 formed from halftone material is formed on a translucent substrate 4, such as a quartz (Qz) substrate. Next, a Cr film 2 is formed on the HT film 3, and a first resist 1 is applied on the Cr film 2.

Next, as shown in FIG. 1B, a first pattern, which includes a dicing mark section and a pattern section, is drawn on the first resist 1. Further, the first resist 1 drawn the first pattern thereon is developed.

Subsequently, as shown in FIG. 1C, the Cr film 2 and the HT film 3 are etched away from the dicing mark section and the pattern section with the first resist 1 as a mask.

Next, as shown in FIG. 1D, the first resist 1 is removed from the completely-light-shielding Cr section, the dicing mark section, and the pattern section. Thus, a HT pattern is formed.

Next, as shown in FIG. 1E, a second resist 6 is applied to the completely-light-shielding Cr section, the dicing mark section, and the pattern section. Subsequently, as shown in FIG. 1F, a second pattern, which includes a dicing mark section and a pattern section, is drawn on the second resist 6. Further, the second resist 6 drawn the second pattern thereon is developed. Next, as shown in FIG. 1G, the Cr film 2 is removed from the dicing mark section and the pattern section by means of etching with the second resist 6 as a mask (an etching process). Thereby, a Cr setback type structure is formed in the dicing mark section (a setback type structure formation process). Finally, as shown in FIG. 1H, the second resist 6 is exfoliated from the completely-light-shielding Cr section, the dicing mark section, and the pattern section. A Cr pattern is now formed by the above-described process shown in FIGS. 1E to 1H.

As described above, the photo mask, which has the structure of self-aligned type in the completely-light-shielding Cr section, the structure of Cr setback type in the dicing mark section, and the structure of HT pattern type in the pattern section, is manufactured. Use of the above-described method of manufacturing the photo mask prevents formation of a HT slit at the outermost periphery.

As a method of forming the above-mentioned Cr setback type structure in the dicing mark section, there may be a following method.

After formation of the second resist 6, a pattern data, which pertain only to the dicing mark section (i.e., the section for which formation of the Cr setback type structure is required), is extracted from a data of the first pattern for first drawing (to be used for forming the HT pattern). Next, a pattern data for second drawing (to be used for forming the Cr pattern) is prepared by means of applying a predetermined declination to the extracted pattern data. Here, the predetermined declination corresponds to the regions from which the Cr film 2 is removed. Next, second drawing is performed through use of the prepared pattern data. Subsequently, above-mentioned development process and etching process are performed. Further, the second resist 6 is exfoliated. Thus, Cr setback type structure is formed in the dicing mark section.

The Cr setback type structure may be formed by another method that a pattern edge is set back by means of a process of formation of the Cr pattern (DOSE for drawing, over-development, and over-etching).

Figure 2B:
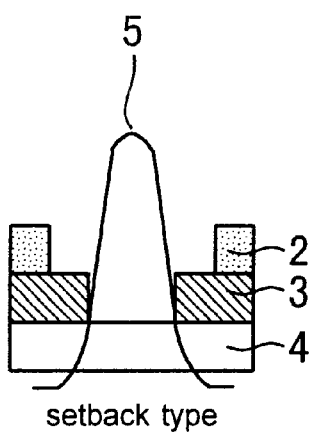
Figure 2C:
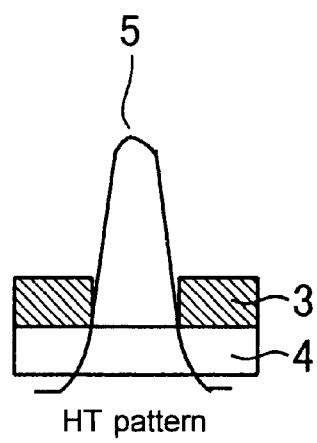

FIGS. 2A to 2C are cross-sectional views for describing an optical image appearing from a HT photo mask at the time of pattern defect inspection. More particularly, FIG. 2A shows an optical image appearing from a light-shielding structure of self-aligned type in a completely-light shielding Cr section at the time of pattern defect inspection. FIG. 2B shows an optical image appearing from light-shielding structure of Cr setback type in a dicing mark section at the time of pattern defect inspection. FIG. 2C shows an optical image appearing from a HT pattern at the time of pattern defect inspection. In FIGS. 2A to 2C, reference numeral 5 designates an optical image. As can be seen from FIGS. 2A to 2C, a difference between the rising edge of the optical image appearing in the pattern section and the rising edge of the optical image appearing in the dicing mark section becomes small at the time of inspection of defects in the photo mask, thereby achieving sufficient defect inspection sensitivity.

In the first embodiment, the completely-light-shielding Cr section has the structure of self-aligned type, the dicing mark section has the structure of Cr setback type, and the pattern section has the structure of HT pattern type. As a result, the geometry of a resist on a wafer after a photo mask pattern has been transferred onto the wafer through exposure is made appropriate, and sufficient defect inspection sensitivity can be ensured during a photo mask defect inspection operation.

Second Embodiment

The first embodiment has described the photo mask in which only the dicing mark section has a setback structure. The present embodiment describes a photo mask in which a completely-light-shielding Cr section as well as the dicing mark section assumes a setback structure.

FIGS. 3A to 3H are cross-sectional views for describing the flow of manufacturing a photo mask according to a second embodiment of the present invention. In FIGS. 3A through 3H, illustrations provided in the left-side column show a completely-light-shielding Cr section in a scribe region; illustrations provided in the center column show a dicing mark section in the scribe region; and illustrations provided in the right-side column show a pattern section in a device region.

First, as shown in FIG. 3A, a halftone (HT) film 3 formed from halftone material is formed on a translucent substrate 4, such as a quartz (Qz) substrate. Next, a Cr film 2 is formed on the HT film 3, and a first resist 1 is applied on the Cr film 2.

Next, as shown in FIG. 3B, a first pattern, which includes a dicing mark section and a pattern section, is drawn on the first resist 1. Further, the first resist 1 drawn the first pattern thereon is developed.

Subsequently, as shown in FIG. 3C, the Cr film 2 and the HT film 3 are etched away from the dicing mark section and the pattern section with the first resist 1 as a mask.

Next, as shown in FIG. 3D, the first resist film 1 is removed from the completely-light-shielding Cr section, the dicing mark section, and the pattern section. Thus, a HT pattern is formed.

Next, as shown in FIG. 3E, a second resist 6 is applied to the completely-light-shielding Cr section, the dicing mark section, and the pattern section. Subsequently, as shown in FIG. 3F, a second pattern, which includes a completely-light-shielding Cr section, a dicing mark section, and a pattern section, is drawn on the second resist 6. Further, the second resist 6 drawn the second pattern thereon is developed. Next, as shown in FIG. 3G, the Cr film 2 is removed from the completely-light-shielding Cr section, the dicing mark section, and the pattern section by means of etching with the second resist 6 as a mask (an etching process). Thereby, a Cr setback structure is formed in the completely-light-shielding Cr section and the dicing mark section. Finally, as shown in FIG. 3H, the second resist 6 is exfoliated from the completely-light-shielding Cr section, the dicing mark section, and the pattern section. A Cr pattern is now formed by the process shown in FIGS. 3E to 3H.

As described above, the photo mask, which has the structure of Cr setback type in the completely-light-shielding Cr section, the structure of Cr setback type in the dicing mark section, and the structure of HT pattern type in the pattern section, is manufactured. Use of the above-described method involves formation of a HT slit at the outermost periphery.

As a method of forming the above-mentioned Cr setback type structure in the completely-light-shielding Cr section and the dicing mark section, there may be a following method.

After formation of the second resist 6, a pattern data, which pertain only to completely-light-shielding Cr section and the the dicing mark section (i.e., section for which formation of the Cr setback type structure is required), is extracted from a data of the first pattern for first drawing (to be used for forming the HT pattern). Next, a pattern data for second drawing (to be used for forming the Cr pattern) is prepared by means of applying a predetermined declination to the extracted pattern data. Here, the predetermined declination corresponds to the regions from which the Cr film 2 is removed. Next, second drawing is performed through use of the prepared pattern data. Subsequently, above-mentioned development process and etching process are performed. Further, the second resist 6 is exfoliated. Thus, Cr setback type structure is formed in the completely-light-shielding Cr section and the dicing mark section.

The Cr setback type structure may be formed by another method that a pattern edge is set back by means of a process of formation of the Cr pattern (DOSE for drawing, over-development, and over-etching).

As is the case in the first embodiment, in the second embodiment, a difference between the rising edge of the optical image appearing in the pattern section and the rising edge of the optical image appearing in the dicing mark section becomes small at the time of inspection of-defects in a photo mask, thereby achieving sufficient defect inspection sensitivity.

In the second embodiment, the completely-light-shielding Cr section has the structure of Cr setback type, the dicing mark section has the structure of Cr setback type, and the pattern section has the structure of HT pattern type. As a result, as is the case in the first embodiment, in the present embodiment, the geometry of a resist on a wafer after a photo mask pattern has been transferred onto the wafer through exposure is made appropriate, and sufficient defect inspection sensitivity can be ensured during a photo mask defect inspection operation.

Figure 4:
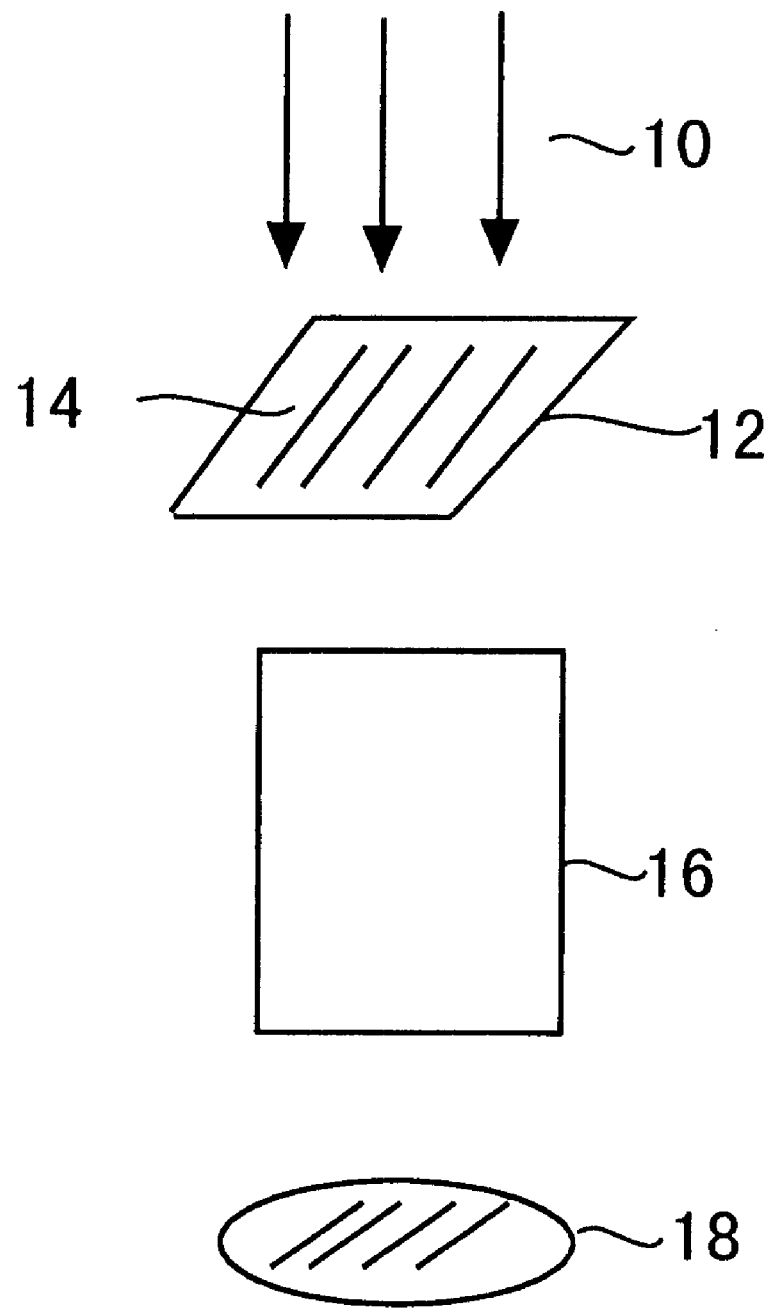
FIG. 4 is a view for describing a method of manufacturing a semiconductor device according to the present invention.
Figure 5A:
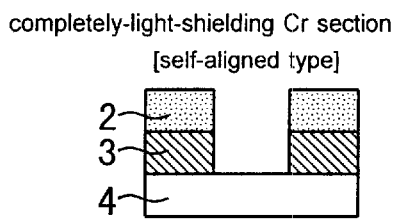
FIGS. 5A to 5C are cross-sectional views for describing the structure of one conventional HT photo mask.
Figure 5B:
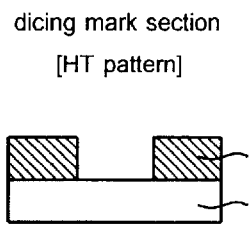
Figure 5C:
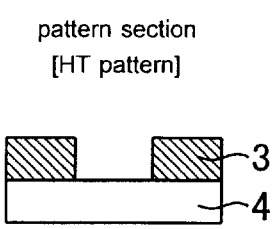
Figure 6A:
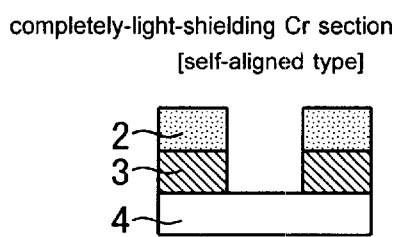
FIGS. 6A to 6C are cross-sectional views for describing the structure of another conventional HT photo mask.
Figure 6B:
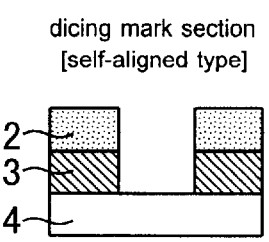
Figure 6C:
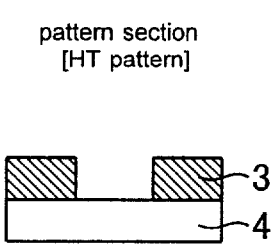

There can be provided a method of manufacturing a semiconductor device using the photo mask according to the present invention. FIG. 4 shows a method of manufacturing a semiconductor device. As shown in FIG. 4, reference numeral 10 designates light (exposure light); 12 designates a mask (photo mask) to be exposed to the exposure light 10; 14 designates a pattern to be drawn on the mask 12; 16 designates an aligner (projection optical system); and 18 designates a semiconductor device (wafer) to be manufactured.

In FIG. 4, the photo mask 12 has a film formed from halftone material on a translucent substrate. The photo mask 12 employs a light-shielding structure of self-aligned type and a light-shielding structure of Cr setback type in combination as a light-shielding structure in a scribe-line region. Further, the photo mask has a light-shielding structure of halftone pattern in a device region.

This invention, when practiced illustratively in the manner described above, provides the following major effects:

By means of the photo mask, the method of forming the photo mask, and the method of manufacturing a semiconductor device according to the present invention, the completely-light-shielding Cr section assumes a light-shielding structure of self-aligned type; the dicing mark section assumes a light-shielding structure of Cr setback type; and the pattern section assumes a light-shielding structure of HT pattern type. As a result, there can be provided a photo mask which makes appropriate the geometry of a resist on a wafer after a photo mask pattern has been transferred onto the wafer by exposure and which ensures sufficient defect detection sensitivity during inspection of defects of the photo mask.

The same advantage can also be attained by a photo mask in which the completely-light-shielding Cr section assumes a structure of Cr setback type, the dicing mark section assumes a structure of Cr setback type, and a pattern section assumes a structure of HT pattern type: the method of manufacturing the photo mask; and a method of manufacturing a semiconductor device.

Further, the present invention is not limited to these embodiments, but variations and modifications may be made without departing from the scope of the present invention.

The entire disclosure of Japanese Patent Application No. 2001-019244 filed on Jan. 26, 2001 containing specification, claims, drawings and summary are incorporated herein by reference in its entirety.

What is claimed is:

1. A photo mask having a film formed from halftone material on a translucent substrate, wherein
a light-shield structure of self-aligned type and a light-shielding structure of chromium (Cr) setback type are used in combination for a light-shielding structure in a scribe-line region; and
a halftone pattern is used for a light-shielding structure in a device region.

2. The photo mask according to claim 1, wherein said light-shielding structure of self-aligned type is used in a completely-light-shielding Cr section of the scribe-line region; and
said light-shielding structure of Cr setback type is used in a dicing mark section of the scribe-line region.

3. The photo mask according to claim 1, wherein said light-shielding structure of self-aligned type is used in a completely-light-shielding Cr section of the scribe-line region; and
said light-shielding structure of Cr setback type is used in a dicing mark section of the scribe-line region.

4. The photo mask according to claim 1, wherein the translucent substrate is a quartz substrate.

5. A method of manufacturing a semiconductor device through use of the photo mask according to claim 1.

6. A method of manufacturing a photo mask having a completely-light-shielding Cr section, a dicing mark section, and a pattern section, the method comprising the steps of:
forming a halftone film formed from halftone material on a translucent substrate;
forming a chromium (Cr) film on the halftone film;
applying a first resist on the Cr film;
drawing a first pattern on the first resist in the dicing mark section and the pattern section;
developing the first resist on which the first pattern is drawn;
etching the Cr film and the halftone film away from the dicing mark section and the pattern section;
exfoliating the first resist from the completely-light-shielding Cr section, the dicing mark section, and the pattern section;
applying a second resist to the completely-light-shielding Cr section, the dicing mark section, and the pattern section;
drawing a second pattern on the second resist in the dicing mark section and the pattern section;
developing the second resist on which the second pattern is drawn;
forming a Cr setback structure in the dicing mark section by means of etching the Cr film away from the dicing mark section and the pattern section; and
exfoliating the second resist from the completely-light-shielding Cr section, the dicing mark section, and the pattern section.

7. The method of manufacturing a photo mask according to claim 6, wherein the Cr setback structure is further formed in the completely-light-shielding Cr section by means of etching the Cr film away from the completely-light-shielding Cr section in addition to the dicing mark section and the pattern section.

8. The method of manufacturing a photo mask according to claim 7, wherein in said step of drawing a second pattern, a data of the second pattern is prepared by means of applying a predetermined declination to a data of the first pattern, the first pattern pertaining a region to be formed a setback structure in the dicing mark section and the completely-light-shielding Cr section.

9. The method of manufacturing a photo mask according to claim 7, wherein in said steps of forming the Cr setback structure and drawing the second pattern, the Cr setback structure is formed by setting back a pattern edge of the Cr film by way of a process for patterning the Cr film in the dicing mark section and the completely-light-shielding Cr section.

10. The method of manufacturing a photo mask according to claim 6, wherein in said step of drawing a second pattern, a data of the second pattern is prepared by means of applying a predetermined declination to a data of the first pattern, the first pattern pertaining a region to be formed a setback structure in the dicing mark section.

11. The method of manufacturing a photo mask according to claim 6, wherein in said steps of forming the Cr setback structure and drawing the second pattern, the Cr setback structure is formed by setting back a pattern edge of the Cr film by way of a process for patterning the Cr film in the dicing mark section.

12. The method of manufacturing a photo mask according to claim 6, wherein the translucent substrate is a quartz substrate.

* * * * *